United States Patent [19]

Hwang

[11] Patent Number: 5,793,080
[45] Date of Patent: Aug. 11, 1998

[54] NONVOLATILE MEMORY DEVICE

[75] Inventor: Hyun Sang Hwang, Seoul, Rep. of Korea

[73] Assignee: LG Semicon Co., Ltd., Chungcheongbuk-do, Rep. of Korea

[21] Appl. No.: 718,224

[22] Filed: Sep. 20, 1996

Related U.S. Application Data

[60] Continuation of Ser. No. 478,472, Jun. 7, 1995, abandoned, which is a division of Ser. No. 135,261, Oct. 12, 1993, Pat. No. 5,459,091.

[51] Int. Cl.⁶ ............................................. H01L 29/788
[52] U.S. Cl. ....................................... 257/316; 257/322
[58] Field of Search ............................... 257/316, 317, 257/318, 319, 320, 321, 322, 323; 365/185

[56] References Cited

U.S. PATENT DOCUMENTS

| | | | |
|---|---|---|---|
| 4,698,787 | 10/1987 | Mukherjee et al. | 365/185 |
| 4,852,062 | 7/1989 | Baker et al. | 365/185 |
| 5,482,879 | 1/1996 | Hong | 257/316 |
| 5,569,946 | 10/1996 | Hong | 257/316 |

FOREIGN PATENT DOCUMENTS

| | | | |
|---|---|---|---|
| 0531707 | 3/1993 | European Pat. Off. | 257/316 |
| 54-22170 | 2/1979 | Japan . | |
| 60-50964 | 3/1985 | Japan | 257/316 |
| 61-58272 | 3/1986 | Japan . | |
| 62-85468 | 4/1987 | Japan . | |
| 63-229860 | 9/1988 | Japan | 365/185 |
| 63-260179 | 10/1988 | Japan | 365/185 |
| 1-140775 | 6/1989 | Japan . | |
| 4-91471 | 3/1992 | Japan | 257/316 |
| 4-155870 | 5/1992 | Japan | 257/316 |
| 5-129627 | 5/1993 | Japan | 257/316 |

*Primary Examiner*—Carl W. Whitehead
*Assistant Examiner*—Alice W. Tang
*Attorney, Agent, or Firm*—Morgan, Lewis & Bockius LLP

[57] ABSTRACT

A nonvolatile memory device includes a semiconductor substrate of a first conductivity type; a gate insulating film formed on the substrate; a floating gate having a first region and a second region, the first region lying flat over the gate insulating film and the second region being extended from a first end portion of the first region and perpendicular to the first region; a control gate extending parallel to the second region of the floating gate, lying over the second end portion of the first region of the floating gate and perpendicular to the first region; an inter-insulating layer disposed between the floating gate and the control gate; a first spacer formed at a side wall of the second region of the floating gate and a second spacer formed at a side wall defined by the floating gate and the control gate; a high density source region of a second conductivity type formed in the substrate, being disposed a thickness of the first spacer distant from the floating gate; a first high density drain region of the second conductivity type formed in the substrate, underlapping the floating gate; and a second high density drain region of the second conductivity type formed in the substrate, being disposed a thickness of the second spacer distant from the floating gate and adjacent to the first high density drain region.

11 Claims, 6 Drawing Sheets

F I G.5
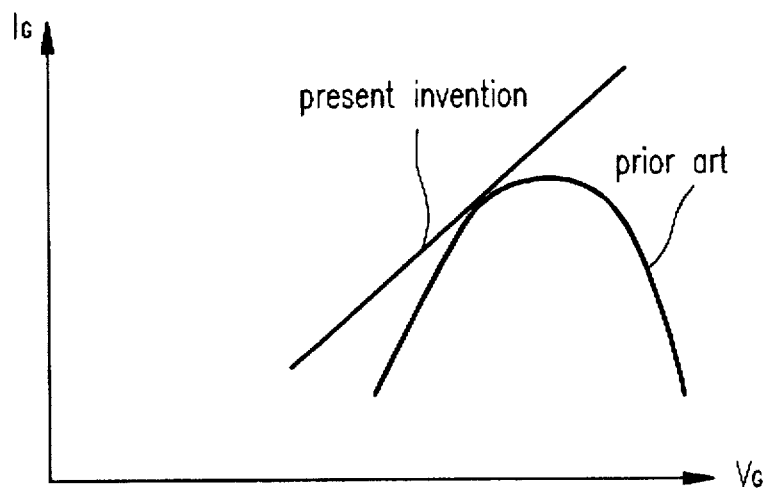
F I G.6
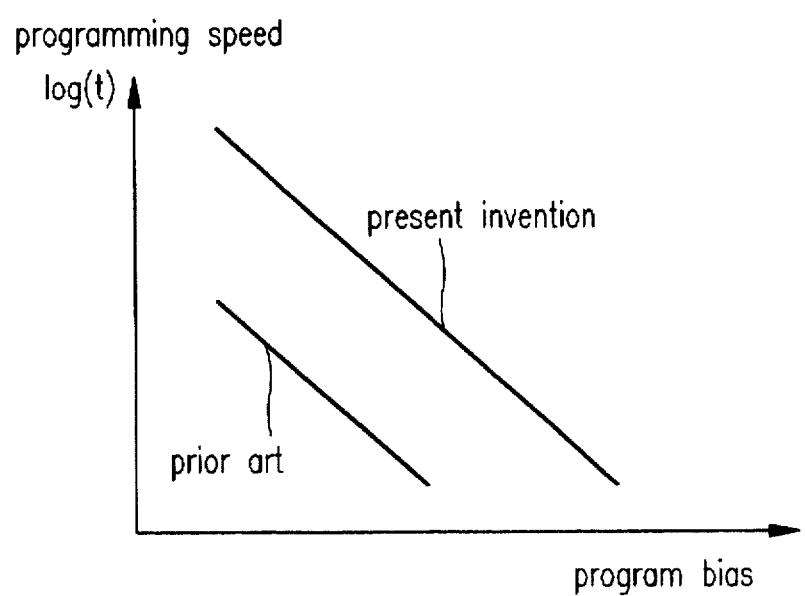

5,793,080

NONVOLATILE MEMORY DEVICE

This application is a continuation of application Ser. No. 08/478,472, filed Jun. 7, 1995, now abandoned, which is a divisional of application Ser. No. 08/135,261, filed Oct. 12, 1993, which issued as U.S. Pat. No. 5,459,091.

BACKGROUND OF THE INVENTION

1. Field of the Invention

The present invention relates in general to a nonvolatile memory device and a method for the fabrication of the same, and more particularly to improvements in a coupling ratio, a programming speed and an integration degree along with the nonvolatile memory device and the method.

2. Description of the Prior Art

Generally, a memory device may be either a volatile memory device or a nonvolatile memory device. In the volatile memory device, new information can be stored with stored, old information erased, whereas in the nonvolatile memory device, "programmed" information is stored permanently.

As a representative of the volatile memory device, there is a random access memory (RAM), which is an array of memory cells that stores information in binary form in which information can be randomly written into, or read out of, each cell as needed. In other words, the RAM is a read-write memory. On the other hand, in a read only memory (ROM), which is a representative of the nonvolatile memory device, "programmed" information is stored in the memory, and only the read operation is performed.

As a nonvolatile memory device, there are also an erasable programmable ROM(EPROM) and an electrically-erasable programmable ROM(EEPROM), in which the stored information is erasable and new information can be reprogrammed. The EPROM and the EEPROM are identical in programming information and are distinct from each other in their erasing operation. In other words, while the EPROM can be erased only with ultraviolet light, the EEPROM can be erased electrically. However, the EPROM and the EEPROM are the same in their fundamental structure and operation.

In scaling an EEPROM or an EPROM device down to deep sub-micron, many problems occur such that, for example, a coupling ratio and a programming speed are lowered. Accordingly, the integration degree becomes restricted.

Hereinafter, the prior art EPROM and EEPROM devices will be discussed along with the problems generated therein for better understanding of the background of the invention, referring to the accompanying drawings and initially to FIG. 1. There is a sectional view showing the structure of a conventional EPROM cell having a symmetric structure. As shown in FIG. 1, such EPROM cell includes a semiconductor substrate 11 insulated by an insulating film 12 from a floating gate 13 which is covered with an inter-layer insulating film 14 that insulates a control gate 15 from the floating gate, such substrate having a source region 16 and a drain region 17 therein which are separated by a channel region 18 from the source region 16 and overlaps with the gate 13.

Information is stored in the floating gate 13, which is formed on the channel region 18 defined between the source region 16 and the drain region 17 in the substrate. The mechanism for storing information is that, on applying a voltage at the control gate 15, hot electrons of high energy are generated at the channel region 18 and are then injected by the electric field applied at the control gate 15 into the floating gate 13 through the gate insulating film 12 and stored therein. The information stored in the floating gate 13 can be erased with ultraviolet light.

However, the symmetric EPROM cell in which each of the source region 16 and the drain region 17 overlaps with the channel region has a low coupling ratio and only a little electric current is generated by the hot electrons therein, which do, in turn, generate such a problem that program efficiency decreases. In addition, for the sake of obtaining a large quantity of gate current, a relatively high voltage must be applied at the control gate 15 for programming. However, an implicated external circuit is required to apply the high voltage at the control gate, so that the integration degree of cell may be not heightened sufficiently.

A detailed description will be given next for a conventional method for fabricating an asymmetric EPROM device in reference with FIGS. 2a–2d.

Firstly as shown in FIG. 2a, over a p-type substrate 21 is formed a pair of gate oxide films 23, on which a pair of gates 25, control gates 29 and inter-layer insulating films 27 between the gates 25 and the control gates 29 are then formed, respectively. Thereafter, a thin insulating film is formed on the entire resultant structure.

Subsequently as shown in FIG. 2b a thick, insulating film is deposited and is then subjected to an anisotropic etching to form spacers 33 at side walls of the gates.

As shown in FIG. 2c, the next step is to remove one of the spacers formed at the side walls of the gate. For this, a photoresist film is completely coated and is then subjected to a patterning to form a photoresist pattern 35, exposing the spacer 33 formed at one side wall of the gate.

Lastly as shown in FIG. 2d, a source region and a drain region are formed. Using the insulating film 31 as an etching stopper, the exposed spacers 33 are removed by applying a dry etching. Thereafter, the photoresist pattern 35 is removed, leaving spacers 33 formed at one side wall of the gate. Following this, n type dopants are implanted at a high density in the substrate to form impurity regions 37 and 39 therein. For reference, the n$^+$ type impurity region 37 acts as a source region in the memory cell, whereas the n$^+$ impurity region 39 acts as a drain region.

In the conventional EPROM device having a stack gate structure, the source region 37 is formed in such an asymmetric structure that the source region 37 overlaps with the gate and the drain region 39 does not overlap with it. In such EPROM device of stack structure, a high voltage must be applied at the drain region 39 for programming. The high voltage allows a large quantity of gate current to be generated, so that the programming speed is faster than in the conventional symmetric EPROM device.

However, the conventional method for fabricating an asymmetric EPROM device adopting a photo etching process has a limit in highly integrating a cell since a gate cannot be defined to deep sub-micron with the conventional photo etching process.

In addition, since the coupling ratio between the control gate and the floating gate is low as shown in FIGS. 2a–2d, there also occurs the problem that programming efficiency decreases.

Turning now to FIG. 3, there is a sectional view showing a conventional asymmetric EEPROM device. The device is formed of a substrate 41 in which a drain region 43 having a shallow junction and a relative deep source region 42 is formed, both defining a channel 44 therebetween. In the device, a gate insulating film 45 is formed over the channel region 44, extending into the drain region 43 and overlapping with a portion of the source region 42. Over the gate insulating film 45 a floating gate 46 is formed which is insulated by an inter-layer insulating film 47 from a control gate 48 in order to provide a high capacitance.

Though the conventional EEPROM cell has an asymmetric structure, it is different from the asymmetric EPROM device of FIG. 2. That is, in the EEPROM device, the source region 42 and the drain region 43 overlap the gate, individually, the former consisting of a shallow junction diffusion region 42-1 and a deep junction diffusion 42-2, and the latter consisting of a single, shallow diffusion region.

In the conventional EEPROM structure, if the drain region 43 is provided with a higher voltage than the source region 42 and the control gate 48 is provided with a relatively much higher voltage, hot electrons are generated in the channel region 44. These hot electrons are then injected, via the gate film 45, into and stored in the floating gate 46. Accordingly, information is programmed in the EEPROM device.

An erasing operation is achieved by floating the drain region 43 and applying a high voltage at the source region 42 with the control gate 48 being maintained with a ground voltage. Under this condition, a tunnelling phenomenon occurs in the overlapping portion between the floating gate 46 and the source region 42, so that the information stored in the floating gate 46 can be erased.

In the conventional EEPROM device, capacitive coupling between the floating gate 46 and the control gate 48 plays an important role in determining the amount of charge that is stored in and drawn out of the floating gate 46. In other words, as the capacitive coupling ratio becomes large, the gate current is generated in large quantities. Accordingly, the programming speed is enhanced.

Since the floating gate and the control gate are in a relation of flat structure in such conventional EEPROM device like the EPROM device of FIG. 2, the gate is required to be lengthened in order to enlarge the overlapping area between the floating gate 46 and the control gate 48. However, the length of gate has influence on the integration degree of the device, so that its size is restrained and thus the overlapping area between the gates is also limited. Accordingly, the coupling ratio decreases, so that the programming speed slows.

SUMMARY OF THE INVENTION

For solving the aforementioned problems, the present inventors have recognized that there exist a need for a nonvolatile memory device capable of achieving a high programming speed with a low voltage and a high integration degree and for a method for fabricating such a nonvolatile memory device.

Accordingly, in an aspect of the present invention, there is provided a nonvolatile memory device in which a coupling ratio is markedly enhanced.

According to another aspect of the present invention, there is provided a nonvolatile memory device in which a gate current is maximized.

According to a further aspect of the present invention, there is provided a nonvolatile memory device in which a control gate and a floating gate are defined to deep submicron.

According to still a further aspect of the present invention, there is provided a method for fabricating the nonvolatile memory device.

The above objects are accomplished by providing a method which comprises the steps of depositing a CVD oxide film over a first conductive semiconductor substrate; applying a photo etching to the CVD oxide film so as to form a portion of the substrate; forming a gate oxide film on the exposed portion of the substrate; coating a first polysilicon film, an inter-layer insulating film and a second polysilicon film over the entire resultant structure, in sequence; applying an etch back process to the first polysilicon film, the inter-layer insulating film and the second polysilicon film so as to form a gate at a side wall of the CVD oxide film; implanting dopants of a second conductivity in the substrate so as to form a high density drain region having a shallow junction; removing the CVD oxide film; coating an oxide film over the entire resultant structure; applying an anisotropic etching so as to form spacers at both side walls of the gate; implanting dopants of second conductivity so as to form a high density source region and drain region having a deep junction.

In accordance with the present invention, the nonvolatile memory device formed by the method comprises a semiconductor substrate of a first conductivity; a gate insulating film formed on the substrate; a gate comprising a floating gate, a control gate and an inter-layer insulating film; a pair of spacers formed at both side walls of the gate; a high density source region of second conductivity formed in the substrate, being the thickness of the spacer distant from floating gate; a first high density drain region of second conductivity formed in the substrate, underlapping the floating gate; and a second high density drain region of second conductivity, being the thickness of the spacer distant from the floating gate and adjacent to the first high density drain region.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawings:

FIG. 5 is a graph showing gate currents in dependance with gate voltages in a device according to the present invention and a conventional device; and FIG. 6 is a graph showing the relation between the programming speed and the program vias according to the present invention and the prior art.

DETAILED DESCRIPTION OF THE PREFERRED EMBODIMENTS

Hereinafter, preferred embodiments of the invention will be described in detail with reference to the drawings.

Referring initially to FIGS. 4a–4h, there is a process flow for the fabrication of EEPROM device according to one embodiment of the present invention.

Figure 1:
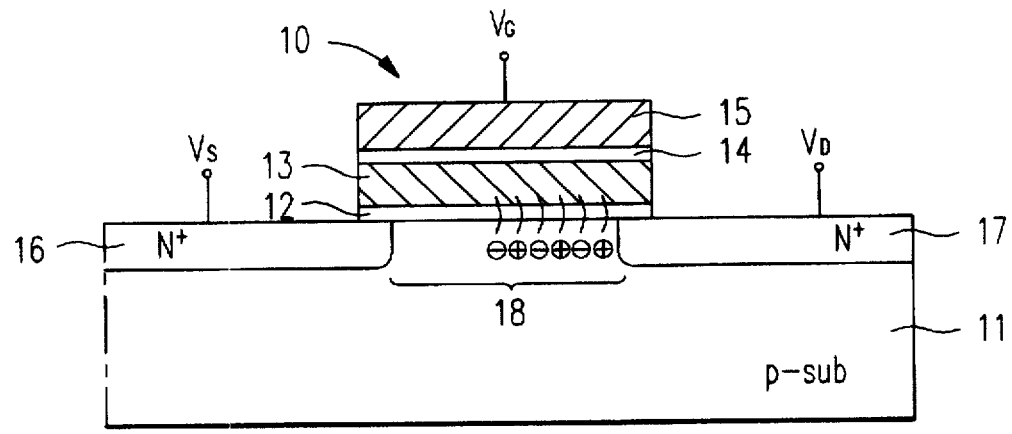
FIG. 1 is a schematic sectional elevation view showing a conventional symmetric EPROM device.
Figure 2A:
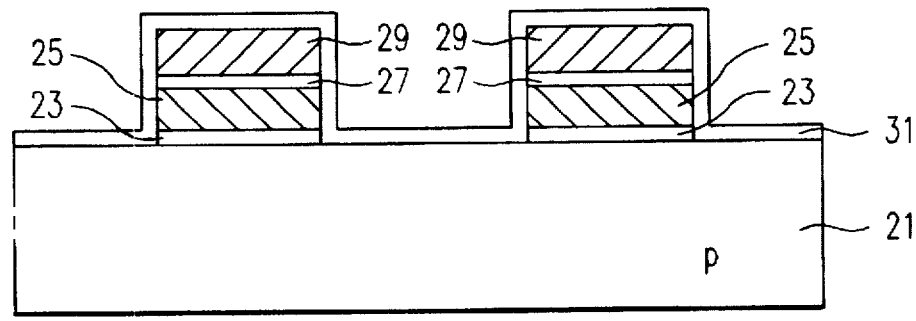
FIGS. 2a–2d are step diagrams showing a method for fabricating a conventional asymmetric EEPROM.
Figure 2B:
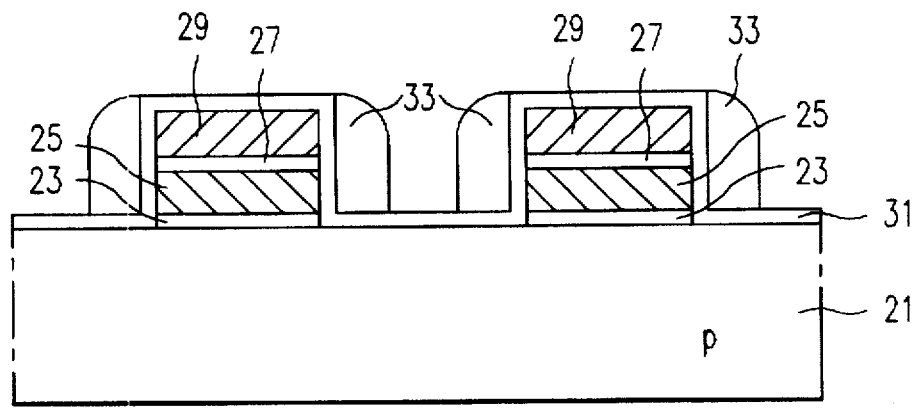
Figure 2C:
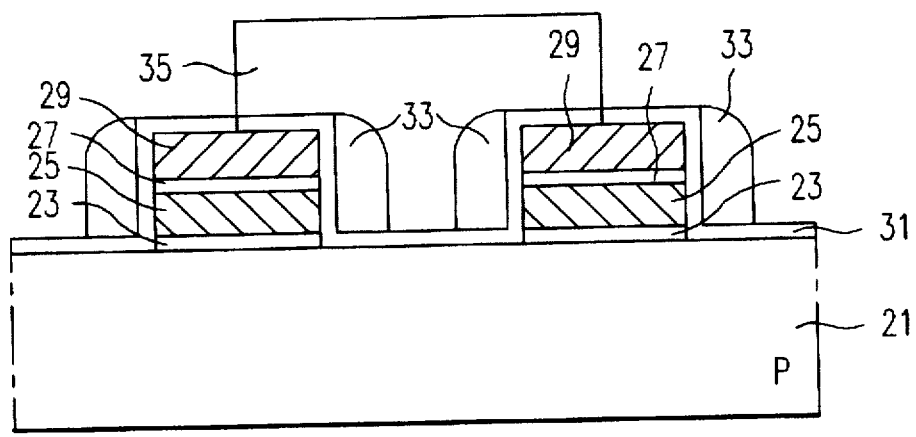
Figure 2D:
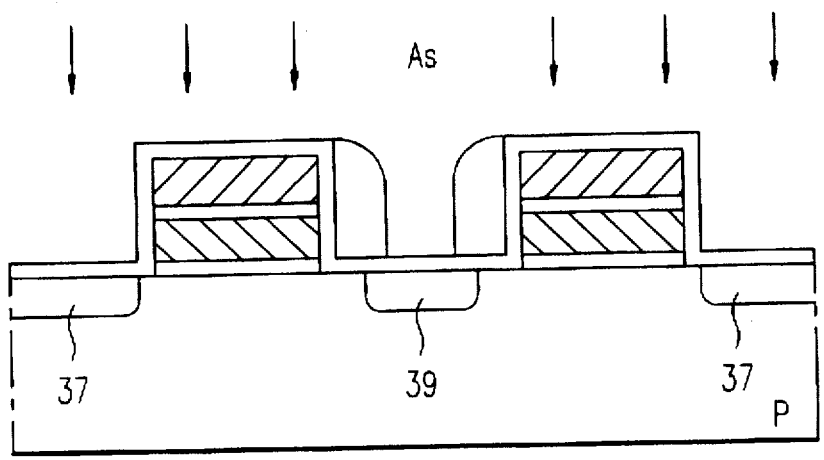
Figure 3:
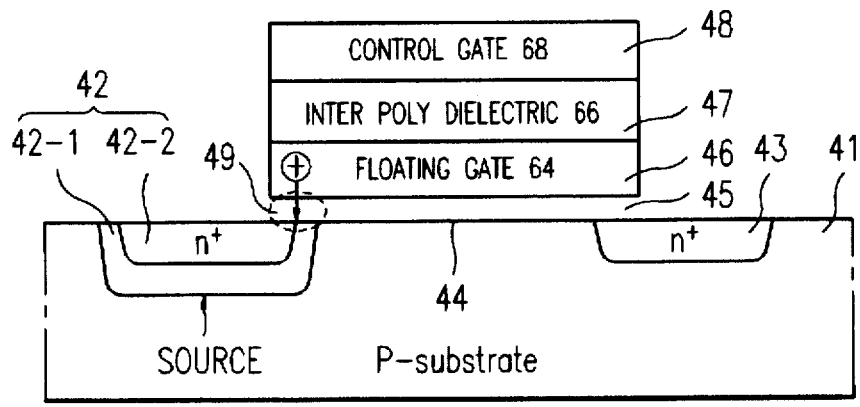
FIG. 3 is a schematic sectional elevation view showing a conventional asymmetric EPROM device.
Figure 4A:
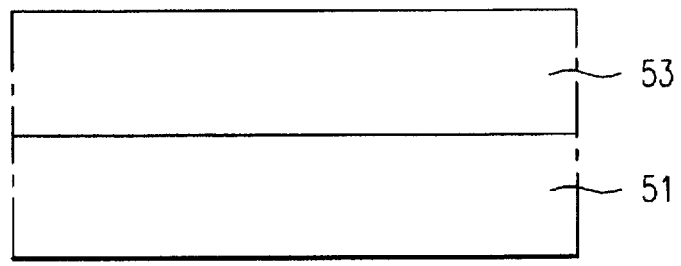
FIGS. 4a–4h are step diagrams showing a method for fabricating an asymmetric EEPROM device according to the present invention.

Firstly in step A as shown in FIG. 4a, over a p-type semiconductor 51 is deposited a CVD oxide film 53.

Figure 4B:
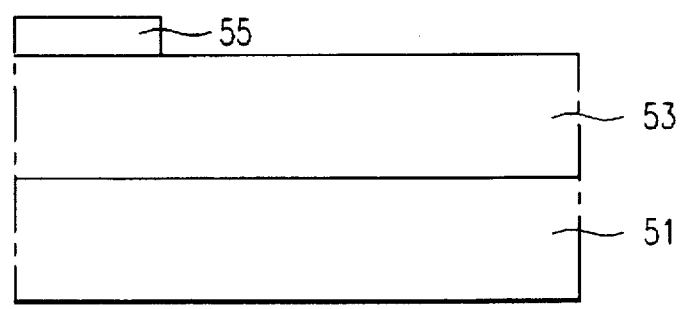

Subsequently in step B as shown in FIG. 4b, the CVD oxide film 53 is coated with a photoresist film which is then subjected to a patterning such as to leave a photoresist pattern 55 on only a portion wherein a source region is to be formed in a later step. As a result, a portion of the CVD film is exposed.

Figure 4C:
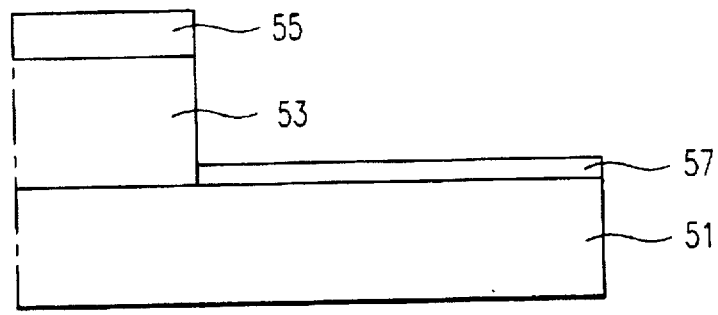

Next in step C as shown in FIG. 4c, using the photoresist film as a mask, the exposed CVD oxide film 53 is subjected to the treatment of photo etching, followed by the formation of a gate insulating film 57 over the resultant CVD film-removed substrate.

Figure 4D:
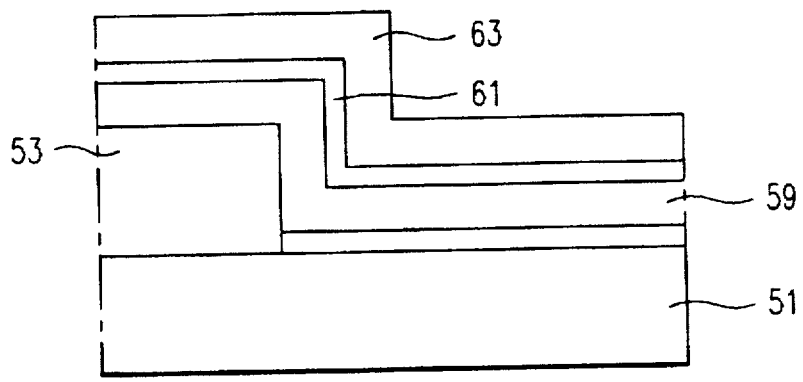

As shown in FIG. 4d, step D is undertaken to first remove the photo-resist film 55 and then carry out depositing a first polysilicon film 59, an inter-layer insulating film 61 and a second polysilicon film 63 over the entire resultant structure, in sequence, as shown.

Figure 4E:
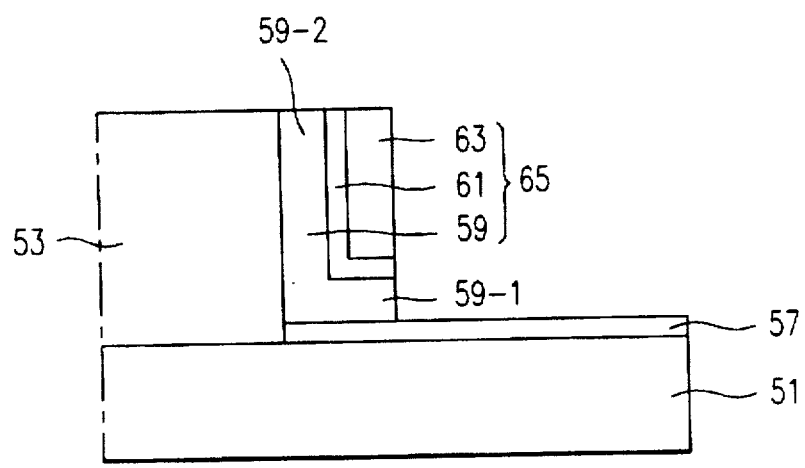

In step E as shown in FIG. 4e, an etch back process is carried out to form a gate 65 at one side portion of the CVD oxide film, leaving the gate shaped into a side wall. During this process, the first polysilicon film 59 is formed into a floating gate, whereas the second polysilicon film 63 is formed into a control gate.

Accordingly, the gate 65 is comprised of the floating gate 59, the control gate 63 and the inter-layer insulating film 61 formed therebetween which provides a large quantity of capacitance. The floating gate 59 consist of a region 59-1 formed flat on the gate insulating film 57 and a region 59-2 extended along the side wall of the CVD oxide film 53 from a portion of the region 59-1, perpendicular to the region 59-1. The flat region 59-1 and the extended region 59-2 are identical in thickness.

The control gate 63 is structured so as to be extended along to the vertical direction which is, perpendicular to the flat region 59-1 of the floating gate 59.

The inter-layer insulating film 61 which insulates the floating gate 59 from the control gate 61 is disposed therebetween, and made of a thin dielectric substance film having oxide-nitride-oxide structure.

In accordance with the present invention, the first polysilicon film 59, the inter-layer insulating film 61 and the second polysilicon film 63 are deposited with the desired thickness, respectively, so that the length of the gate can be defined into deep sub-micron or less.

Figure 4F:
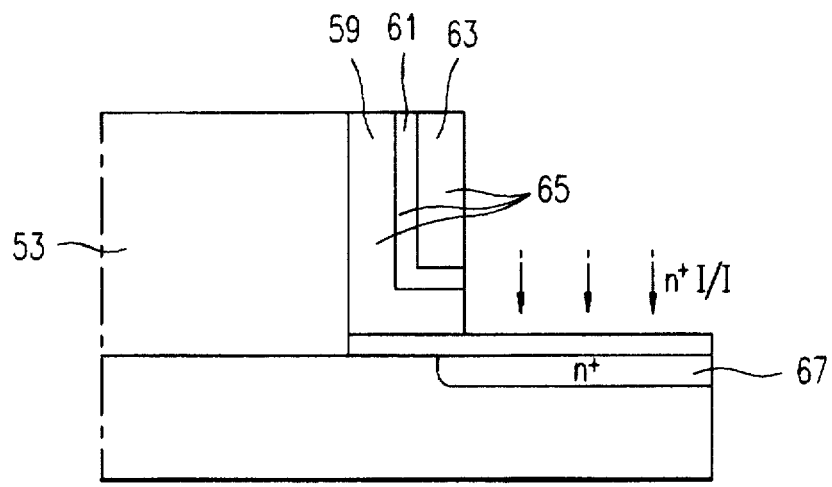

In step F as shown FIG. 4f, using the CVD oxide film 53 and the gate 65 as a mask, n-type dopants are implanted in the substrate at a high density to form a $n^+$ type diffusion region 67 having a shallow junction therein. Such diffusion region 67 constitutes a drain region, which erases the information stored in the floating gate 59.

Figure 4G:
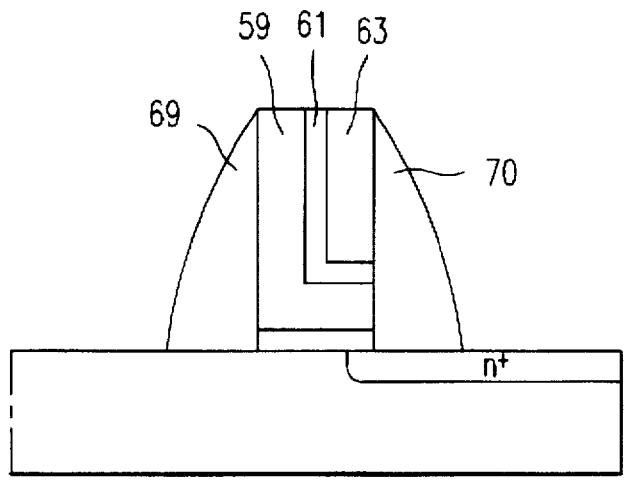

Next, as seen in step G as shown in FIG. 4g, spacers are formed. For this, the CVD oxide film 53 is removed, followed by the deposition of an oxide film over the entire surface of the resultant structure. Thereafter, an anisotropic etching is applied to the oxide film so as to form spacers 69 and 70 at the side walls of the gate 65. While one spacer 69 is formed at one side wall of the gate 65, the other spacer 70 is formed at the other side wall of the gate 65.

Figure 4H:
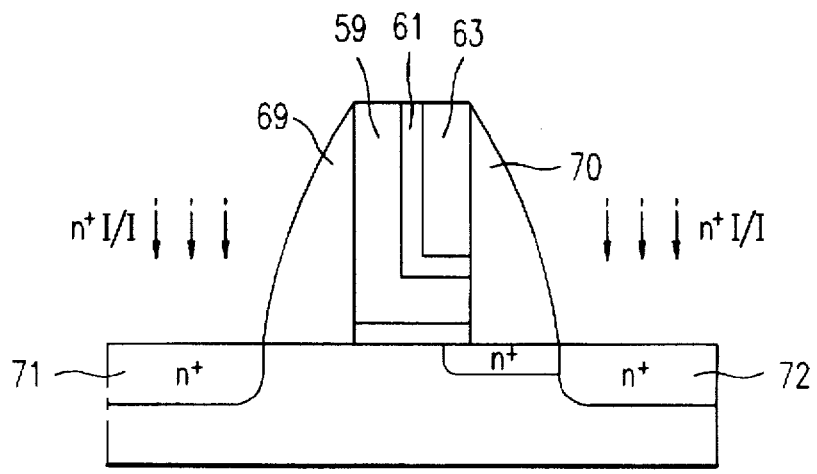

Lastly in step H as shown in FIG. 4h, using the gate 65 and the spacers 69 and 70 as a mask, n-type dopants are implanted at a high density in the substrate so as to form diffusion regions 71 and 72 having a deep junction.

The diffusion region 71, which constitutes a source region, is the thickness of the spacer 69 distant from the gate. The diffusion region 72, which constitutes the drain region together with the shallow junction diffusion region 67 is the thickness of the spacer 70 distant from the gate, as well.

With regard to the drain region 72, it consists of the shallow junction diffusion region 67 which has a high impurity density and underlaps the floating gate 59 and the deep junction diffusion region which has a high impurity density and is formed adjacent to the shallow junction diffusion region 67, so that the gate 65 overlaps with the drain region, in part. On the other hand, the source region consists of only the deep junction diffusion region which has a high impurity density and does not underlap the floating gate, so that the gate 65 does not overlap with the source region. As described above, the source region and drain region have an asymmetric structure.

In accordance with the present invention, the nonvolatile memory device formed by the method comprises a semiconductor substrate of first conductivity; a gate insulating film formed on the substrate; a floating gate having two regions integrally formed, with the first region lying flat over the gate film and the second region being extended from an end portion of the first region, perpendicular to the first region; a control gate extended to the direction which is perpendicular to the flat region of the floating gate, lying over the other end portion of the flat region of the floating gate and an inter-layer insulating film disposed between the floating gate and the control gate, providing a large capacitance; a pair of spacers, one spacer being formed at side wall of the extended region of the floating gate and the other spacer being formed at the side wall which consists of the floating gate and the control gate; a high density source region of second conductivity formed in the substrate, being the thickness of the former spacer distant from the floating gate; a first high density drain region of second conductivity formed in the substrate, underlapping the floating gate; and a second high density drain region of second conductivity, being the thickness of the latter spacer distant from the floating gate and adjacent to the first high density drain region.

In the EEPROM device of the present invention, information is programmed in the floating gate 59 by the gate current generated at source region 71, whereas erasing operation is achieved by drawing out the information stored in the floating gate into the drain region 67 and 72.

FIG. 5 shows gate currents in dependance with gate voltages in an inventive device and a conventional device. As shown in FIG. 5, the inventive device is superior in the gate current to the conventional device.

FIG. 6 is a graph showing the relation between the programming speed and the program vias according to the present invention and the prior art. It is obvious that the programming speed of the inventive is excellent, as shown in the figure.

As explained hereinbefore, in the prior art nonvolatile memory device having a stack structure, the control gate lies flat over the floating gate, that is, merely, the lower surface of the control gate overlaps the upper surface of the floating gate, so that the coupling ratio is low. In contrast, in the inventive nonvolatile memory device, the floating gate takes the shape of "L" providing the control gate with two surfaces which can overlap with the corresponding surface of the control gate, that is, the lower surface and the one side surface of the control gate, so that the coupling ratio is enhanced.

In addition, according to the present invention, the source region does not underlap the gate as well as is the thickness of the spacer distant from the gate, and contributes to the asymmetric structure in the nonvolatile memory device together with the drain region that underlaps the gate, so that the gate current can be maximized. Accordingly, a high programming speed is possible even with a lower voltage, as shown in FIGS. 5 and 6.

Furthermore, in accordance with the present invention, the floating gate and the control gate can be formed into a side wall by an ordinary etching process, being defined to a deep sub-micron or less. Moreover, according to the present invention, a shallow junction drain region can be formed without a conventional, complicated spacer-removing process, thereby improving the integration degree of device.

What is claimed is:

1. A nonvolatile memory device comprising:
   a semiconductor substrate of a first conductivity type;
   a gate insulating film on the substrate;
   a floating gate having a first region and a second region, the first region lying flat over the gate insulating film and the second region being perpendicular to the first region;
   a control gate extending parallel to the second region of the floating gate, laying over the first region of the floating gate and perpendicular to the first region;
   an inter-insulating layer disposed between the floating gate and the control gate;
   a first insulating spacer formed at a sidewall of a second region of the floating gate;
   a second insulating spacer formed at a sidewall defined by the floating gate and the control gate;
   a source region of a second conductivity type formed in the substrate, being spaced apart from the floating gate;
   a first drain region of the second conductivity type formed in the substrate, under the second insulating spacer; and,
   a second drain region of the second conductivity type formed in the substrate, being spaced apart from the floating gate, wherein the second drain region is as deep as the source region and is deeper than the first drain region.

2. The nonvolatile memory device according to claim 1, wherein the first drain region acts as a path for erasing information stored in the floating gate.

3. The nonvolatile memory device according to claim 1, wherein a lower surface and a side surface of the control gate overlaps with an upper surface of the first region and a side surface of the second region of the floating gate, respectively.

4. The nonvolatile memory device according to the claim 1, wherein a thickness of the first region and a width of the second region of the floating gate are identical.

5. The nonvolatile memory device according to the claim 1, wherein the source region, the first drain region and the second drain region all have substantially the same doping concentration.

6. The nonvolatile memory device according to the claim 1, wherein the source region, the first drain region and the second drain region are all N+ conductivity type.

7. A nonvolatile memory device, comprising:
   a semiconductor substrate of a first conductivity type;
   a gate insulating film formed on the substrate;
   a floating gate having a first region and a second region, the first region lying flat over the gate insulating film and the second region being perpendicular to the first region;
   a control gate extending parallel to the second region of the floating gate, lying over the first region of the floating gate and perpendicular to the first region;
   an inter-insulating layer disposed between the floating gate and the control gate;
   a first insulating spacer formed at a side wall of the second region of the floating gate and a second insulating spacer formed at a side wall defined by the floating gate and the control gate;
   a high density source region of a second conductivity type formed in the substrate, being disposed a thickness of the first insulating spacer distant from the floating gate;
   a first high density drain region of the second conductivity type formed in the substrate, under lapping the floating gate; and
   a second high density drain region of the second conductivity type formed in the substrate, being disposed a thickness of the second insulating spacer distant from the floating gate and adjacent to the first high density drain region;
   wherein the high density source region, the first high density drain region, and the second high density drain region are all $N^+$ conductivity type; and
   wherein said second high density drain region is as deep as said high density source region and is deeper than said first high density drain region.

8. The nonvolatile memory device according to claim 1, wherein said first high density drain region acts as a path for erasing information stored in said floating gate.

9. The nonvolatile memory device according to claim 7, wherein a lower surface and an side surface of said control gate overlaps with an upper surface of said first region and an side surface of said second region of said floating gate, respectively.

10. The nonvolatile memory device according to claim 7, wherein a vertical thickness of said first region and a horizontal width of said second region of said floating gate are identical.

11. The nonvolatile memory device according to claim 7, wherein the high density source region, the first high density drain region, and the second high density drain region all have substantially the same doping concentration.

* * * * *

UNITED STATES PATENT AND TRADEMARK OFFICE
CERTIFICATE OF CORRECTION

PATENT NO. : 5,793,080
DATED : August 11, 1998
INVENTOR(S) : Hwang

It is certified that error appears in the above-identified patent and that said Letters Patent is hereby corrected as shown below:

Column 8, line 40, change "claim 1" to --claim 7--.

Signed and Sealed this

Second Day of March, 1999

Attest:

Q. TODD DICKINSON

*Attesting Officer*      *Acting Commissioner of Patents and Trademarks*